United States Patent
Miller et al.

(10) Patent No.: US 9,691,583 B2
(45) Date of Patent: Jun. 27, 2017

(54) IMAGING AND PROCESSING FOR PLASMA ION SOURCE

(71) Applicant: FEI Company, Hillsboro, OR (US)

(72) Inventors: Thomas G. Miller, Portland, OR (US);
Sean Kellogg, Portland, OR (US);
Shouyin Zhang, Portland, OR (US);
Mostafa Maazouz, Hillsboro, OR (US);
Anthony Graupera, Kailua-Kona, HI (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/792,771

(22) Filed: Jul. 7, 2015

(65) Prior Publication Data

US 2015/0380204 A1    Dec. 31, 2015

Related U.S. Application Data (63) Continuation of application No. 13/891,545, filed on May 10, 2013, now Pat. No. 9,105,438.

(Continued)

(51) Int. Cl.
    *H01J 37/10*      (2006.01)
    *H01J 37/08*      (2006.01)
(Continued)

(52) U.S. Cl.
    CPC ............ *H01J 37/08* (2013.01); *H01J 37/026* (2013.01); *H01J 37/10* (2013.01); *H01J 37/16* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 4,670,685 A | 6/1987 | Clark, Jr. et al. | |
| 5,108,535 A | 4/1992 | Ono et al. | |

(Continued)

FOREIGN PATENT DOCUMENTS

| | | |
|---|---|---|
| EP | 2312611 | 4/2011 |
| JP | S5288900 A | 7/1977 |

(Continued)

OTHER PUBLICATIONS

Masanori Komuro, "Radii Broadening Due to Molecular Collision in Focused Ion Beams", American Institute of Physics, Appl. Phys. Lett. 52, Jan. 4, 1988, 3 pages.

(Continued)

*Primary Examiner* — Phillip A Johnston
*Assistant Examiner* — Hsien Tsai
(74) *Attorney, Agent, or Firm* — Scheinberg & Associates, P.C.; Michael O. Scheinberg; John E. Hillert (57) ABSTRACT

Applicants have found that energetic neutral particles created by a charged exchange interaction between high energy ions and neutral gas molecules reach the sample in a ion beam system using a plasma source. The energetic neutral create secondary electrons away from the beam impact point. Methods to solve the problem include differentially pumped chambers below the plasma source to reduce the opportunity for the ions to interact with gas.

18 Claims, 4 Drawing Sheets

Related U.S. Application Data (60) Provisional application No. 61/653,930, filed on May 31, 2012.

(51) Int. Cl.
*H01J 37/02* (2006.01)
*H01J 37/16* (2006.01)
*H01J 37/18* (2006.01)
*H01J 37/30* (2006.01)
*H01J 37/317* (2006.01)

(52) U.S. Cl.
CPC .......... *H01J 37/18* (2013.01); *H01J 37/185* (2013.01); *H01J 37/3007* (2013.01); *H01J 37/3171* (2013.01); *H01J 2237/0492* (2013.01); *H01J 2237/08* (2013.01); *H01J 2237/18* (2013.01); *H01J 2237/188* (2013.01); *H01J 2237/31713* (2013.01); *H01J 2237/31749* (2013.01)

(56) References Cited

U.S. PATENT DOCUMENTS

| | | | |
|---|---|---|---|
| 5,188,705 A | | 2/1993 | Swanson et al. |
| 5,313,067 A | | 5/1994 | Houk et al. |
| 5,518,572 A | | 5/1996 | Kinoshita et al. |
| 5,652,427 A | * | 7/1997 | Whitehouse ........ H01J 49/0481 250/282 |
| 7,241,361 B2 | | 7/2007 | Keller et al. |
| 7,339,163 B2 | | 3/2008 | Marriott |
| 7,442,942 B2 | | 10/2008 | Takahashi et al. |
| 7,582,885 B2 | | 9/2009 | Katagiri et al. |
| 7,670,455 B2 | | 3/2010 | Keller et al. |
| 7,858,926 B1 | * | 12/2010 | Whitehouse .......... H01J 49/004 250/281 |
| 8,053,725 B2 | | 11/2011 | Schwind et al. |
| 8,076,650 B2 | | 12/2011 | Smith et al. |
| 8,087,379 B2 | * | 1/2012 | Chandler ............ B81C 1/00531 118/723 E |
| 8,124,942 B2 | | 2/2012 | Graupera et al. |
| 8,168,957 B2 | | 5/2012 | Keller et al. |
| 8,253,118 B2 | | 8/2012 | Zhang et al. |
| 8,283,629 B1 | | 10/2012 | Tuggle et al. |
| 8,294,093 B1 | | 10/2012 | Tuggle et al. |
| 8,405,054 B2 | | 3/2013 | Smith et al. |
| 8,445,870 B2 | | 5/2013 | Zhang et al. |
| 8,455,822 B2 | | 6/2013 | Rue |
| 2005/0019961 A1 | | 1/2005 | Davis et al. |
| 2007/0138404 A1 | * | 6/2007 | Frosien ................ H01J 5/02 250/398 |
| 2007/0210260 A1 | * | 9/2007 | Horsky .................. C23C 14/48 250/424 |
| 2009/0218486 A1 | | 9/2009 | Whitehouse et al. |
| 2010/0323508 A1 | * | 12/2010 | Adibi ................... C23C 14/042 438/513 |
| 2012/0032092 A1 | | 2/2012 | Graupera et al. |
| 2012/0091360 A1 | | 4/2012 | Zhang et al. |
| 2012/0217152 A1 | | 8/2012 | Miller |
| 2012/0280136 A1 | | 11/2012 | Zhang et al. |
| 2012/0319000 A1 | | 12/2012 | Keller et al. |
| 2012/0328771 A1 | | 12/2012 | Papasouliotis et al. |
| 2013/0015765 A1 | | 1/2013 | Graupera et al. |
| 2013/0112890 A1 | | 5/2013 | Parker et al. |
| 2013/0134307 A1 | | 5/2013 | Routh, Jr. |
| 2013/0140450 A1 | | 6/2013 | Graupera et al. |
| 2013/0248490 A1 | | 9/2013 | Rasmussen et al. |

FOREIGN PATENT DOCUMENTS

| | | |
|---|---|---|
| JP | 2011100722 A | 5/2011 |
| WO | 9216008 | 9/1992 |

OTHER PUBLICATIONS

Tohru Ishitani et al., "Focused-Ion-Beam Broadening Due to Collisions with Residual Gas Atoms", Japanese Journal of Applied Physics, vol. 26, No. 10, Oct. 1987, 4 pages.

\* cited by examiner

FIG. 1

Prior Art

FIG. 4 excessive markdown characters in the output?

IMAGING AND PROCESSING FOR PLASMA ION SOURCE

This Application claims priority from U.S. patent application Ser. No. 13/891,545 filed May 10, 2013 which claims U.S. Provisional Application 61/653,930, filed May 31, 2012, both of which are hereby incorporated by reference.

TECHNICAL FIELD OF THE INVENTION

The present invention relates to focused ion beam systems that use a plasma ion source and that can form a sub-micron spot on the work piece.

BACKGROUND OF THE INVENTION

Focused ion beam systems are used to fabricate or alter microscopic or nanoscopic structures. Some focused ion beam (FIB) columns use a plasma ion source, such as the inductively coupled plasma (ICP) source described in U.S. Pat. No. 7,241,361, which is assigned to the assignee of the present invention. Focused ion beam systems using plasma ion sources, such as that described above, have several advantages over systems using liquid metal ion sources. For example, plasma ion sources can provide a higher brightness with reduced energy spread. Plasma ion sources can provide a variety of ion species, some of which have higher sputter yields and do not contaminate the sample.

Figure 1:
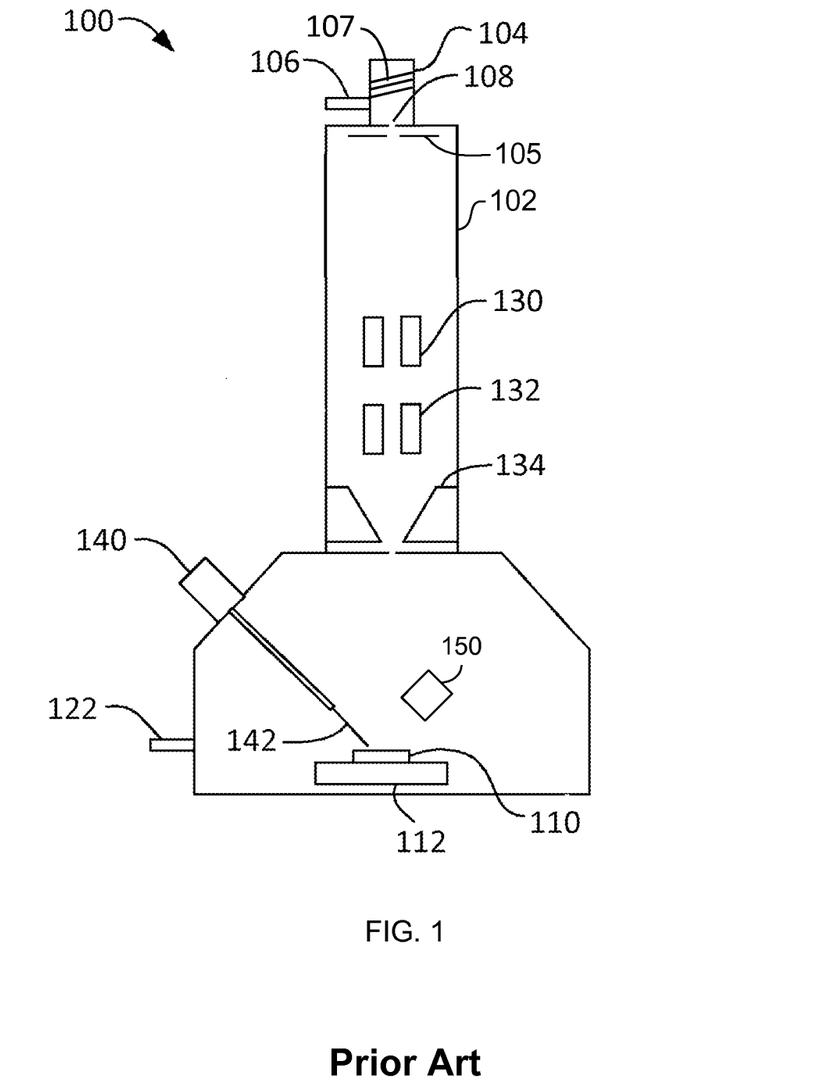
FIG. 1 shows a schematic of a prior art ion beam system having a plasma source.

FIG. 1 shows schematically an ICP system according to the prior art that is described in U.S. Pat. No. 7,241,361. System 100 includes an ion beam column 102 with a plasma ion source including a plasma chamber 104 which is supplied with gas or gases through a capillary or flow restrictor through gas inlet 106. A coil 107 is coupled by an impedance matching circuit to an RF source, not shown, to supply energy to ionize the gas in the plasma chamber 104. System 100 preferably includes a means to reduce the energy spread of ions in the ion beam. Such a means can include a split Faraday shield to reduce capacitive coupling between the antenna 107 and the plasma or a balanced antenna. Ionized gas atoms or molecules are extracted from plasma chamber 104 by an extraction electrode 105 that pulls ions through an aperture 108 that serves as a source electrode that electrically biases to the plasma to a high potential, that is, greater than 10,000 V. Ions are accelerated toward a work piece 110 positioned on an adjustable stage 112. Ion beam systems also typically include a beam blanker 130 for blanking the ion beam, beam deflectors 132 for positioning the beam, and a focusing lens 134 to collimate or focus the beam of ionized molecules.

Typically, only a very small percent of the atoms or molecules in the plasma chamber are ionized. Neutral atom can diffuse through the aperture from which the ions are extracted. The neutral atoms, however, have very low energy because they are not accelerated by the extraction electrode. It has been thought that very few of the low energy neutral atoms reach the work piece, because they diffuse from the aperture in random directions, collide with elements of the optical column, and are removed by the vacuum pump.

Focused ion beam systems are also used to form microscopic structures by etching material from a work piece or depositing material onto a work piece. The ions can remove material from the surface by sputtering, that is, momentum transfer from the ion to atoms in the work piece. The ions can also activate a precursor gas that decomposes in the presence of the ion beam to deposit a material or to form a volatile compound with the target material to enhance etching of the target. Ion beam systems often also include a gas inlet for injecting precursor gases 140 and a needle 142 for directing the flow of precursor gases toward the work piece surface.

Focused ion beam system also typically include a secondary electron detector 150, such as an Everhart-Thornley detector, for forming an image as the ion beam scans the sample surface and the ion beam impact produces secondary electrons. The image contrast at each point is determined by the number of secondary ions detected. Applicants have found that secondary electron images formed by the ion beam from a plasma source can have unexpectedly poor contrast. An improved apparatus and method to collect higher quality secondary electron images and to produce higher resolution etching or deposition is therefore needed.

SUMMARY OF THE INVENTION

An object of the invention is to improve processing from a focused ion beam system using a plasma ion source.

Applicants have found that collisions between energetic ions and neutral gas produces high kinetic energetic neutral particles that impact the work piece, thereby degrading imaging and processing. By reducing the contact of the energetic ions with gas diffusing from the plasma chamber, the number of high kinetic energy neutral ions reaching the sample surface is reduced, improving ion beam imaging and processing. In one embodiment, a series of differentially pumped chambers reduce the number of collisions between energetic ions and neutral gas by reducing the amount of gas encountered by the ion beam, thereby reducing the creation of high kinetic energy neutral particles impacting the work piece.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Ions exit the plasma chamber at high kinetic energies, accelerated by the extraction electrode and cathode. The ions are formed into a beam and focused in the focusing column to a fine spot on the work piece. The beam is typically scanned across the sample surface using electrostatic deflectors. Neutral atoms also escape through the aperture, but most of the low speed neutral gas particles collide with elements in the column and very few were thought to reach the work piece.

By investigating the cause of poor contrast in secondary electron images created using a plasma ion source, applicants have found that poor contrast is caused by "energetic neutrals." "Energetic neutrals" are created when an ion with appreciable energy interacts with gas molecules in the beam path in such a manner that a charge exchange takes place. At least some of these "energetic neutrals" have a minimal trajectory change from that of the original ion and because they cannot be focused or deflected travel in a straight line to the sample surface.

The impact of the energetic neutrals with the sample releases secondary electrons, but because the neutral atoms are not focused or scanned with the ion beam, the secondary electron current is emitted from a wide area of the sample. The secondary electron current from the energetic neutrals thus constitutes a "noise" that is detected on top of the secondary electron signal from the beam impact point. The noise reduces the contrast of the ion beam image and can be sufficiently strong to wash out the signal. The energetic neutral particles also cause sputtering and, if a precursor gas is present in the chamber, decomposition of the precursor gas to cause etching or deposition away from the ion beam impact point.

Focused ion beam system using a plasma ion source were typically not used for high precision fabrication because the high energy spread of ions from a plasma source plasma made it difficult to form a small spot. A plasma ion source, as described for example in U.S. Pat. No. 8,053,725, can provide an ion beam in which the ions have a low energy spread. The plasma ion source is more versatile than the liquid metal ion source and can produce a high beam current or a reduced beam current with higher precision. For example, a plasma ion source can produce a beam having an energy spread of less than about 10 eV, and a spot size of less than about 25 nm at a current of about 2 pA. With the development of a high resolution FIB using a plasma ion source, applicants have produced a system that is being used in application previously reserved for liquid metal ion sources. Because of the high resolution of the FIB with the plasma ion source makes possible new applications, new problems arise that were not previously encountered. The problem of reduced image resolution is one such problem.

In the system of FIG. 1, some of the neutral particles leaking from the plasma source through aperture 108 can pass through to ion column 102. The gas pressure in a plasma chamber typically varies between about $10^{-3}$ mbar and about 1 mbar, providing ample opportunity for collisions between ions extracted from the ion source and neutral particles thus creating energetic neutrals directed along the ion column.

Ions extracted by the extraction electrode 105 and accelerated by the potential difference between the plasma and the focusing column collide with those neutral particles and some are neutralized, but retain most of their energy and their momentum toward the work piece. Those energetic neutral particles reach the work piece 110. Because neutral particles do not respond to the fields of the focusing lenses 134, neutral particles that are not blocked by the aperture plates 120 are spread out over areas of the work piece surface 110, typically this is a much larger area than the area scanned by the focused ion beam. While it had been previously thought that very few neutral atoms reach the specimen surface, it appears that the energy neutral particles created by the neutralization of the energetic ions do reach the surface in sufficient quantities to produce adverse effects.

Figure 2:
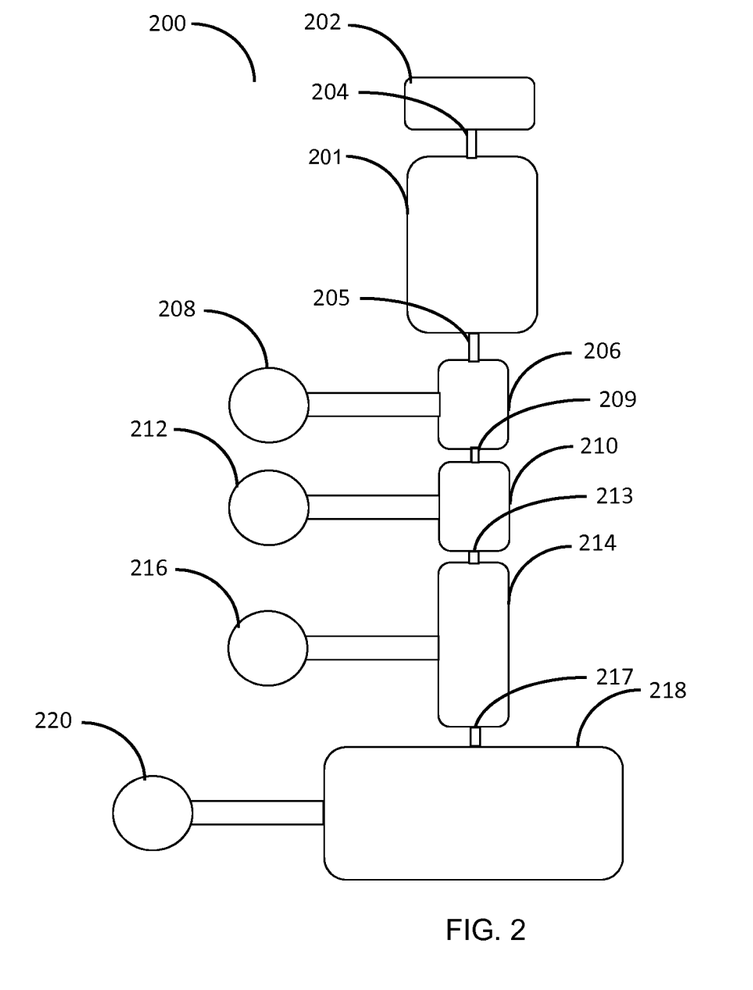
FIG. 2 shows a schematic of a four chamber embodiment of the present invention.

FIG. 2 shows a schematic of an embodiment of the present invention including a focused ion beam column 200 using a plasma chamber 201. Elements of the plasma ion source and the ion column are not shown but are similar to those shown in FIG. 1. A high pressure gas source 202 is connected to plasma chamber 201 via a flow restrictor 204, such as a capillary tube or needle valve, that restricts the flow of gas into plasma chamber 201 and drops the pressure in plasma chamber 201 to typically between $10^{-3}$ mbar and 1 mbar. The term flow restrictor 204 may be interchangeable with the term aperture which equivalently restricts flow of a gas into the plasma chamber. Ions leave plasma chamber 201 through an exit aperture 205, shown schematically as a tube in FIG. 2. Exit aperture 205 has a diameter sufficiently large enough to accommodate the required ion current and in some embodiments the diameter can be close to 2 mm. In some embodiments, the exit aperture is electrically biased to a high voltage to bias the plasma.

Ions leave plasma chamber 201 through the exit aperture 205 and pass through to a first intermediary evacuated vacuum chamber 206. Neutral atoms also diffuse out of exit aperture 205 and into first intermediary evacuated vacuum chamber 206. Collision between the energetic ions having a great momentum in a direction toward the specimen and the less energetic diffusing neutral gas causes a charge exchange that results in energetic neutral particles having a great momentum in the direction of the specimen. By reducing the total amount of gas between the plasma chamber and the specimen, the number of collisions is reduced and fewer energetic neutrals are created.

A measure of the probability of creating energetic neutrals is the product of the number of collisions between energetic ions and neutral gas particles and the probability of the energetic ion picking up a charge from the neutral gas. The probability of a collision depends on the gas pressure in the region through which the beam passes and the path length through that region. Embodiments of the invention reduce the sum of products of pressure and path length by dropping the pressure rapidly to shorten the path length through the higher pressure regions. Embodiments of the invention provide in the beam path multiple differentially pumped chambers separated by pressure limiting apertures, to reduce the gas pressure as the beam gets further from the plasma chamber. While ideally the first vacuum chamber below the plasma would be pumped down to the desired pressure to remove all the gas, in practice, multiple chambers are required because of the practical limits on the pumping speed and the diffusion of gas through the apertures. Further, it is very difficult to transition from a region of high pressure to one of low pressure in which there is an aperture of significant size.

In a preferred embodiment, the sum of the products of the pressure time the path length is less than 3E−3 mbar*mm, preferably less than 3E−4 mbar*mm, and most preferably less than 3E−5 mbar*mm. The probability of creating an energetic neutral is a complicated function of many factors, but for some reasonable assumptions, for each ion launched down the column the pressure length products achieved as described thus preferably leads to a probability of neutral creation that is reduced to less than 1%, more preferably to less than 0.1%, and most preferably to less than 0.01%. The probability of an energetic neutral particle reaching the specimen depends on the probability of the collision that produced the energy neutral not producing such a deflection.

This probability also depends on the energy of the energetic ions. Multiple collisions can also play a role in determining how many energetic neutrals reach the specimen. A further complication is that for each combination of incident ion and target neutral gas species a different probability will result.

Intermediary vacuum chamber 206 is pumped by a high capacity pump 208 capable of handling noble gases, which could be a turbo pump, and is capable of maintaining the chamber 206 at about $10^{-5}$ mbar to $10^{-6}$ mbar. The ion beam and some neutral gas molecules then pass from vacuum chamber 206 through a differential pumping aperture (DPA) 209 to a second intermediary evacuated vacuum chamber 210. The length of the aperture is preferably greater than twice the diameter so that a sufficient vacuum differential can be achieved between the first intermediary evacuated vacuum chamber 206 and the second intermediary evacuated vacuum chamber 210.

Vacuum chamber 210 is evacuated using a second turbo pump 212, which maintains a vacuum of preferably less than $10^{-6}$ mbar more preferably less than $10^{-7}$ mbar. The ion beam and very few neutral gas molecules pass from intermediary vacuum chamber 210 through a second DPA 213 to a final evacuated vacuum chamber 214 which is evacuated using an ion pump 216, which is capable of achieving a very high quality vacuum preferably in the range of 1E−8 mbar to 5E−7 mbar. DPA 213 is typically a tube that is one or two millimeters in diameter and a few millimeters in length.

Intermediary evacuated vacuum chamber 214 is the longest of the intermediary vacuum chambers allowing the beam to spend the most time in the highest quality vacuum environment further reducing the opportunity for energetic neutrals to form. The ion gas beam leaves vacuum chamber 214 through a final DPA 217, typically with a diameter of one or two millimeters, into a sample chamber 218. An evacuation system such as a high powered turbo pump 220 maintains a vacuum of preferably less than $1*10^{-5}$ mbar more preferably less than $1*10^{-6}$ mbar, and even more preferably less than or equal to about $5*10^{-7}$ mbar in the sample vacuum chamber 218 during processing.

The pressure in the sample chamber 218 is typically greater than the pressure in the previous chamber 214. The pressure in the sample chamber 218 may be raised by the use of a precursor gas, or desorption of gases adsorbed onto surfaces when the sample chamber is opened to insert or remove a work piece. A valve may be included to seal chamber 214 when sample chamber 218 is opened to the atmosphere to insert a work piece.

According to one embodiment of the present invention, the plasma gas source 202 is set at a relative pressure ($P_0$). Preferably, the pressure ($P_1$) of the plasma chamber 201 is less than $P_0$. Even more preferably, the pressure ($P_2$) of intermediary vacuum chamber 206 is less than $P_1$, and the pressure ($P_3$) of intermediary chamber is less than $P_2$. In certain embodiments, the pressure ($P_4$) of intermediary chamber 214 can be either greater or less than $P_3$ depending on processing conditions. Finally, the pressure of sample chamber 218 is preferably either greater or less than $P_4$ based on processing conditions.

Those skilled in the art will readily realize that components of the ion beam column such as focusing lenses, beam deflectors, and beam blankers can be placed at any of the different intermediary chambers. Preferably, the final focusing lenses are placed toward the bottom of chamber 214 because optimal spot size is achieved when the final lens to sample distance is minimized.

Figure 3:
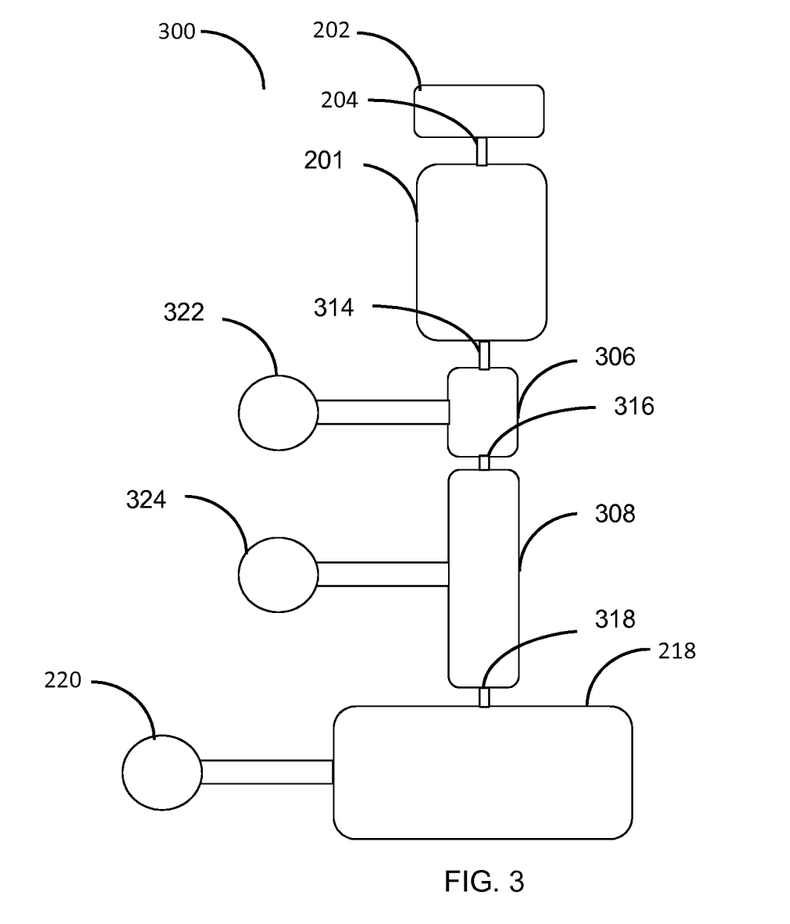
FIG. 3 shows a schematic of another embodiment of the invention.

FIG. 3 shows a schematic of an embodiment of an inductively coupled plasma (ICP) ion beam column 300 according to the method of the present invention. In this system, two evacuated vacuum chambers 306 and 308 are employed in series rather than the three described above. Ions leave plasma chamber 201 through an exit aperture 314, shown schematically as a tube in FIG. 2. Exit aperture 314 has a diameter sufficiently large enough to accommodate the required ion current and in some embodiments the diameter can be close to 2 mm. In some embodiments, the exit aperture is electrically biased to a high voltage to bias the plasma. Ions pass through to a first intermediary evacuated vacuum chamber 306. Neutral atoms also diffuse out of exit aperture 314 and into first intermediary evacuated vacuum chamber 306.

Intermediary vacuum chamber 306 is attached to a pump 322, which is preferably a high capacity pump capable of handling noble gases and maintaining the chamber 306 at about $10^{-5}$ mbar to $10^{-6}$ mbar. The ion beam and some neutral gas molecules then pass from vacuum chamber 306 through a DPA 316 to a second intermediary evacuated vacuum chamber 308 which is evacuated using an ion pump 324. Chamber 308 is the longest of the intermediary vacuum chambers allowing the beam to spend the most time in the highest quality vacuum environment further reducing the opportunity for energetic neutrals to form. The ion gas beam leaves vacuum chamber 308 through a final DPA 318 into a sample chamber 218. It is noted that the term differential pumping aperture is used throughout the description above, but is not meant to limit the present invention. The term DPA is interchangeable with many types of apertures such as a conductance limiting aperture or a pressure limiting aperture.

It is further noted that in the embodiment shown in FIG. 3, the set of intermediary vacuum chambers 306 and 308 and their respective exit apertures and pumps can be identical to any combination of two of the three chambers shown in FIG. 2. Preferably, the pressure at the plasma gas source 202 is highest and the pressure drops as the ions travel through each chamber. In certain embodiments, the pressure at sample chamber 218 is greater than the pressure at intermediary chamber 308 depending on processing conditions.

Figure 4:
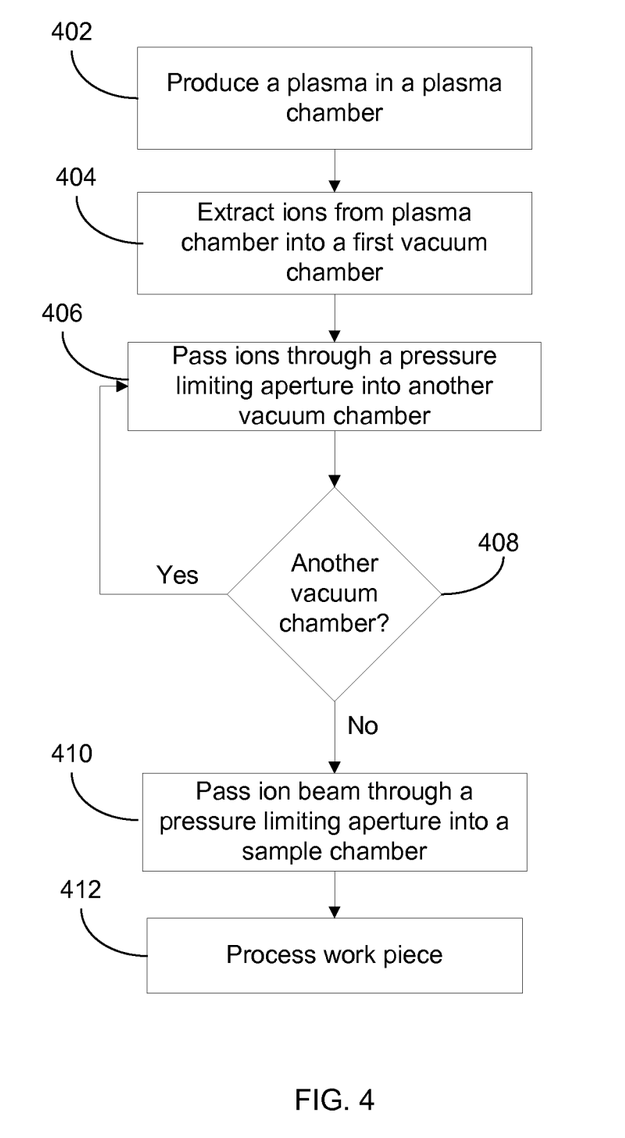
FIG. 4 is a flow chart of an embodiment of the invention.

FIG. 4 is a flow chart of an embodiment of improving ion beam processing in a focused ion beam column using a plasma ion source. In step 402 energy is applied to a gas in the plasma chamber ionizing some of the gas molecules to produce a plasma. Because the gas supplied to the plasma chamber is typically at a very high pressure, the plasma chamber typically has a pressure of between $10^{-3}$ mbar to 1 mbar. In step 404 ionized atoms or molecules are extracted from the plasma chamber using an extraction electrode through an aperture into a first vacuum chamber. At this point some neutral atoms also diffuse through the extraction aperture into the first vacuum chamber. These neutral atoms have very low energy because they are not accelerated by the extraction electrode. It is believed that these low energy neutrals diffuse within the vacuum chamber in random direction and do not continue along the ion column produced by the extraction electrode.

The first vacuum chamber is pumped to reduce the pressure to between $10^{-5}$ mbar and $10^{-6}$ mbar. By reducing the pressure in the vacuum chamber there are fewer neutral gas molecules the ion beam needs to pass through thus reducing the likelihood of collisions between ionized atoms and neutral molecules. The first vacuum chamber is configured to be preferably as short as possible further reducing the opportunity for the ions to collide with neutral molecules before passing through a pressure limiting aperture into second vacuum chamber in step 406. The pressure limiting aperture makes it possible to decrease the pressure in the second chamber even further, typically in the range of $5*10^{-7}$ mbar to $1*10^{-7}$ mbar if using a turbo pump and even further, for example $5*10^{-8}$ if an ion pump is employed for evacuation.

If more than two vacuum chambers are used, conditional step 408 repeats step 406 with a further reduction in the pressure in each subsequent vacuum chamber with the objective being to get the pressure to as low as possible and reduce the number neutral molecule available for collisions that create energetic neutrals. The final vacuum chamber typically has the lowest pressure and is typically longer than the previous vacuum chambers to allow the ion beam to spend the longest time in the lowest pressure environment where collisions with neutral molecules are the least likely.

In step 410 the beam is passed through a pressure limiting aperture into a sample chamber where it is then used to process a work piece in step 412. The pressure limiting aperture between the final vacuum chamber and the sample chamber makes it possible to have a higher pressure in the sample chamber, which would occur is a precursor gas were being used, while still maintaining a very low pressure in the final vacuum chamber. It is noted that the ions can be focused in any of the intermediary vacuum chambers as described above, but the final probe forming focusing is preferably done at the final intermediary vacuum chamber before reaching the sample chamber, but as close to the sample as is possible.

Once processing of the work piece is completed the method is complete.

Embodiments of the present invention can provide one or more advantages over typical prior art ICP ion beam systems. The primary advantage of all of the embodiments is reducing the number of neutrals created as the ion beam passes along the ion beam column between the ion extraction region and the sample surface.

It will be appreciated by those of ordinary skill in the art of ICP ion technology that the multiple vacuum chamber system described above makes it possible to achieve a very high vacuum within a minimal distance travelled from the ion source and that a very high vacuum environment reduces the number of "energetic neutrals" reaching the work piece by reducing the opportunity for ion collisions with neutral gas molecules as the ion beam travels down the column.

In certain embodiments, the multiple vacuum chamber described above can be used in dual-beam systems such as Scanning Electron Microscope (SEM)/ICP-FIB systems. In such a configuration, it is particularly desirable to mitigate neutral particle production because the secondary electrons generated by the FIB can harm SEM imaging.

It will be appreciated by those of skill in the art that the invention described is not limited to inductively coupled plasma sources. The invention described above can be used with other plasma sources, such as a plasma source based on electron cyclotron resonance (ECR).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A focused ion beam system comprising:
   a plasma chamber for containing a plasma;
   a source electrode for biasing the plasma;
   an extraction electrode for extracting ions from the plasma chamber;
   a focusing lens for focusing the ions into a beam directed toward a work piece;
   a sample chamber for containing a work piece, the sample chamber connected to a vacuum pump; and
   a first intermediary vacuum chamber connected at one end to the plasma chamber and connected to a vacuum pump;
   a second intermediary vacuum chamber connected to a vacuum pump;
   a first differential pumping aperture connecting the first intermediary vacuum chamber and the second intermediary vacuum chamber; and
   a second differential pumping aperture connecting the second intermediary vacuum chamber to the sample chamber or to one or more additional intermediary vacuum chambers,
   wherein the focused ion beam system is capable of operating such that a sum of products of pressure times path length through each of the intermediary vacuum chambers and the sample chamber is less than $3 \times 10^{-3}$ mbar*mm.

2. The focused ion beam system of claim 1 in which each of the additional intermediary vacuum chamber has a lower pressure than an immediately preceding intermediary vacuum chamber.

3. The focused ion beam system of claim 1 in which the first intermediary vacuum chamber has a pressure at least five times lower than a pressure in the plasma chamber.

4. The focused ion beam system of claim 1 in which the sample chamber has a pressure higher than an immediately preceding intermediary vacuum chamber.

5. The focused ion beam system of claim 1 in which the sum of the products of the pressure times the path length through each of the intermediary vacuum chambers and the sample chamber is less than $3 \times 10^{-5}$ mbar*mm.

6. The focused ion beam system of claim 1 configured such that a probability of energetic neutral creation is less than 1%.

7. The focused ion beam system of claim 1 configured such that a probability of energetic neutral creation is less than 0.01%.

8. The focused ion beam system of claim 1 further comprising means to reduce an energy spread of ions emitted from the plasma chamber to less than 10 eV.

9. A method of improving ion beam processing using a plasma ion source by reducing the number of energetic neutral particles impacting onto a work piece, comprising:
   applying energy to a gas in a plasma chamber to produce a plasma, the plasma chamber being maintained at a first pressure;
   extracting ions from the plasma chamber into a first intermediary vacuum chamber, the first intermediary vacuum chamber being maintained at a pressure lower than the first pressure;

passing the ions from the first intermediary vacuum chamber through a first differential pumping aperture into a second intermediary vacuum chamber, the second intermediary vacuum chamber being maintained at a pressure lower than that of the first intermediary vacuum chamber;

passing the ions into a sample chamber through a second differential pumping aperture; and focusing the ions onto a work piece to process the work piece with the focused ions, wherein a sum of products of pressure times path length through each of the intermediary vacuum chambers and the sample chamber is less than $3\times10^{-3}$ mbar*mm.

10. The method of claim 9 in which the sum of products of pressure times path length through each of the intermediary vacuum chambers and the sample chamber is less than $3\times10^{-5}$ mbar*mm.

11. The method of claim 9 further comprising reducing a probability of energetic neutral creation from the first intermediary vacuum chamber to the work piece to less than 1%.

12. The method of claim 9 further comprising reducing a probability of energetic neutral creation from the first intermediary vacuum chamber to the work piece to less than 0.01%.

13. The method of claim 9 in which the first intermediary vacuum chamber is maintained at a pressure of between $10^{-5}$ mbar and $10^{-6}$ mbar and the second intermediary vacuum chamber is maintained at a pressure of between $10^{-6}$ mbar and $10^{-7}$ mbar.

14. The method of claim 9 in which extracting ions from the plasma chamber into a first intermediary vacuum chamber includes extracting ions having an energy spread of less than 10 eV.

15. The focused ion beam system of claim 1, wherein:
the vacuum pump connected to the first intermediary vacuum chamber is a different vacuum pump than the vacuum pump connected to the second intermediary vacuum chamber;

the vacuum pump connected to the first intermediary vacuum chamber is capable of maintaining the first intermediary vacuum chamber at a pressure in a range of from about $10^{-5}$ mbar to about $10^{-6}$ mbar; and the vacuum pump connected to the second intermediary vacuum chamber is capable of maintaining the second intermediary vacuum chamber at a pressure in a range of from about $5*10^{-7}$ mbar to about $1*10^{-7}$ mbar.

16. The focused ion beam system of claim 1, wherein:
the vacuum pump connected to the first intermediary vacuum chamber is a turbo pump;

the second intermediary vacuum chamber or an additional intermediary vacuum chamber is connected at one end to the second differential pumping aperture and connected to an ion pump.

17. A focused ion beam system comprising a focused ion beam column, the focused ion beam column including:
a plasma chamber;
a sample chamber;
vacuum chambers connected in series between the plasma chamber and the sample chamber, the vacuum chambers separated by pressure limiting apertures and configured to be differentially pumped during operation of the focused ion beam column, as a focused ion beam passes from the plasma chamber to the sample chamber via the vacuum chambers,
wherein the focused ion beam system is capable of operating such that a sum of products of pressure times path length through each of the vacuum chambers and the sample chamber is less than $3\times10^{-3}$ mbar*mm.

18. The focused ion beam system of claim 17, further comprising vacuum pumps connected to the vacuum chambers and configured to carry out the differential pumping, wherein the differential pumping prevents the creation of energetic neutrals in the focused ion beam column during the operation of the focused ion beam column.

* * * * *